United States Patent [19]

Breneman et al.

[11] Patent Number: 4,980,641
[45] Date of Patent: Dec. 25, 1990

[54] METHOD AND APPARATUS OF REDUCING MAGNETIC HYSTERESIS IN MRI SYSTEMS

[75] Inventors: Bruce C. Breneman; Raymond E. Sarwinski, both of San Diego; Yen-Hwa L. Hsu, Solana Beach, all of Calif.

[73] Assignee: General Atomics, San Diego, Calif.

[21] Appl. No.: 393,400

[22] Filed: Aug. 11, 1989

[51] Int. Cl.⁵ .............................................. G01R 33/20
[52] U.S. Cl. ..................................... 324/318; 335/214
[58] Field of Search ......................... 335/214, 216, 218; 324/300, 307, 309, 318, 320, 319, 322

[56] References Cited

U.S. PATENT DOCUMENTS

| 2,777,099 | 1/1957 | Foss | 317/158 |
| 4,445,102 | 4/1984 | Thorn | 335/297 |
| 4,498,048 | 2/1985 | Lee et al. | 324/307 |
| 4,642,569 | 2/1987 | Hayes et al. | 324/318 |
| 4,672,346 | 6/1987 | Miyamoto | 335/296 |
| 4,737,716 | 4/1988 | Roemer | 324/318 |
| 4,829,252 | 5/1989 | Kaufman | 324/318 |

Primary Examiner—Michael J. Tokar
Attorney, Agent, or Firm—Neil K. Nydegger

[57] ABSTRACT

An apparatus for minimizing hysteresis in a magnetic resonance imaging device of the type utilizing a pair of oppositely charged parallel pole faces forming a magnetic field therebetween, and gradient coils spaced apart from each pole face for producing time varying magnetic fields, comprises a layer of nonferromagnetic conducting material interposed between the pole face and the gradient coil. The interposed layer carries eddy currents induced by time varying magnetic fields produced by the gradient coils, thereby minimizing AC induced eddy current hysteresis from the pole faces. The layer preferably has a thickness of at least one skin depth at the frequency associated with the time varying magnetic field. The layer is preferably contiguous with the pole face, and comprises copper or aluminum. In another embodiment, each pole face has a plurality of slits therethrough radiating inward from the circumference for eliminating the eddy currents in the pole face. The slits in one pole face are preferably symmetrical to those in the other. There are preferably twenty-four (24) slits spaced fifteen degrees (15°) apart. There is also disclosed the method for accomplishing the same.

16 Claims, 1 Drawing Sheet

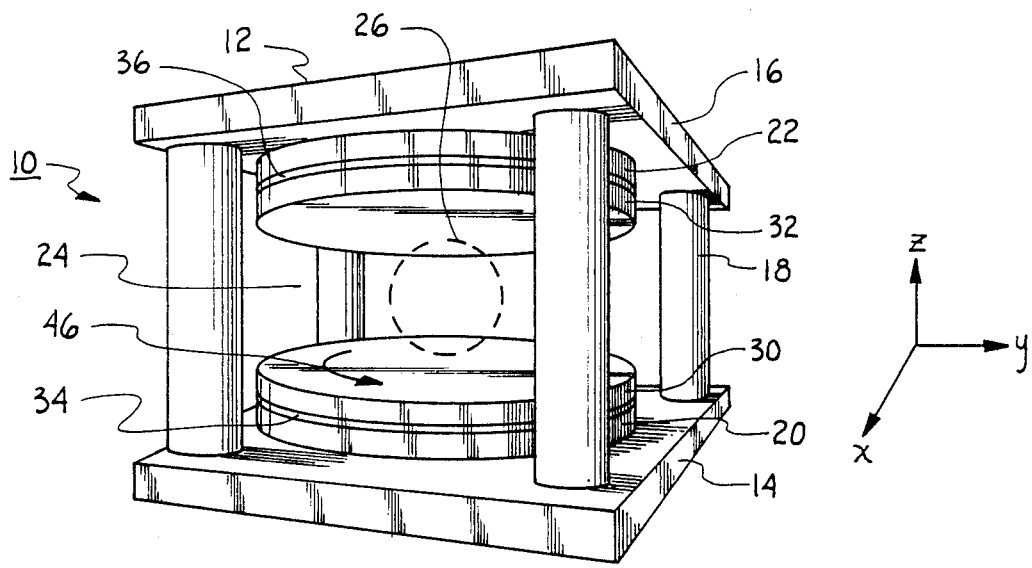
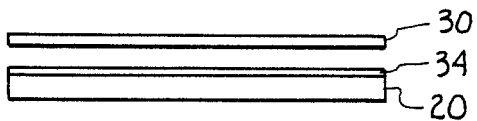
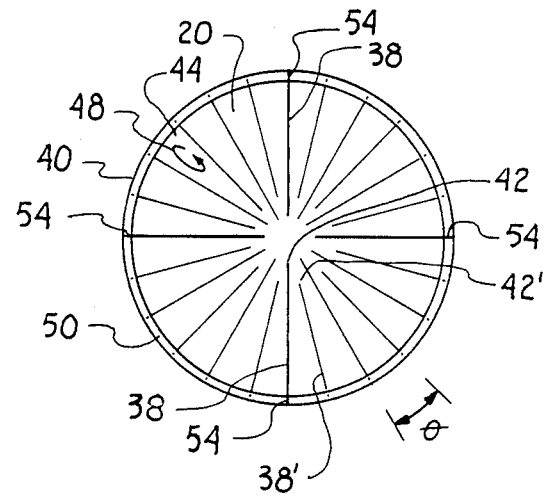
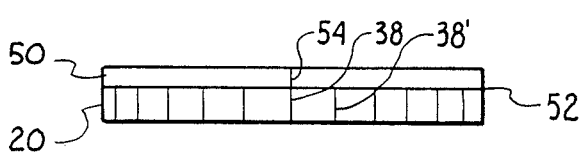

METHOD AND APPARATUS OF REDUCING MAGNETIC HYSTERESIS IN MRI SYSTEMS

FIELD OF THE INVENTION

This invention relates generally to nuclear magnetic resonance imaging (MRI) systems requiring a uniform magnetic field within a large air gap. More specifically, the invention relates to an apparatus incorporated into permanent magnet (MRI) systems for minimizing unwanted magnetic hysteresis to maintain the required homogeneous magnetic field and image quality. The present invention is particularly, though not exclusively, useful for reducing localized linear magnetic gradients due to pulsing of gradient coils, to maintain a highly uniform magnetic field into which a patient can be placed for magnetic resonance imaging.

BACKGROUND OF THE INVENTION

Magnetic resonance imaging (MRI) devices require a highly intense, uniform magnetic field within a volume of sufficient size to allow a patient to be placed in the uniform field. Placing the patient into the field of the MRI system allows observation of living tissue in the patient This is valuable for medical diagnostic purposes, and is very instrumental in the early detection of cancerous tissues, tumors, and the like.

Different types of magnet systems have been proposed and utilized in an attempt to obtain a highly uniform field. Resistive magnet and superconducting magnet systems are two types. Permanent magnet systems are a third type, and appear to offer cost-effective advantages for MRI systems. One general design of a permanent magnet system has been proposed by W. Oldendorf in his article "Nuclear Magnetic Resonance and Correlative Imaging Modalities", Society of Nuclear Medicine, pp. 45-54, 1983. It utilizes an external frame of iron supporting two opposed permanent magnets which are oppositely charged, in which the pole faces have topographies intended to enlarge the useful uniform region of flux into which the patient may be placed for MRI analysis Another structure is that involving substantially parallel flat plates coupled together by a plurality of rod-like yoke portions, such as disclosed in U.S. Pat. No. 4,672,346 to Miyamoto. Another type of permanent magnet MRI system is manufactured by the same assignee of the present invention which utilizes a pair of oppositely charged flat parallel pole faces and attendant structure for providing a magnetic field uniformity in the air gap therebetween of forty (40) parts per million over a thirty (30) centimeter diameter spherical volume having central magnetic field strength of from six one hundredths (0.06) tesla to three tenths (0.3) tesla.

In permanent magnets currently being used in MRI systems, there are certain essential components One such essential component of MRI hardware is the gradient coil which produces localized linear gradients in the x, y, and z direction within the air gap of the MRI device. These local linear gradients are superimposed onto the homogeneous magnetic field within the air gap to provide location information. These gradient coils are utilized to ultimately provide spatial identification within the sphere. The gradient coils are parallel, and typically located a few centimeters from the large flat ferromagnetic pole faces utilized in the permanent magnet MRI devices.

Unfortunately, when these gradient coils are pulsed during the utilization of the MRI system, the pole faces of the MRI device become additionally magnetized so that a substantial remnant gradient in the x, y or z direction exists. Whenever a closed electrical path is exposed to a time varying magnetic field, an AC electrical eddy current is induced in this path. These eddy currents generally have a relatively short time constant and act in a way to oppose the changing magnetic field. It is known that eddy currents flowing in ferromagnetic materials can cause magnetic hysteresis Thus, such remnant gradients add unwanted gradients to the field so as to degrade the homogeneity of the magnetic field in the air gap and further impair image quality Furthermore, it is well known that minimizing eddy current signature, i.e. reducing the time constant and amplitude associated with the transient response, results in beneficial performance of the system.

The present invention thus recognizes the need to minimize such AC eddy current induced hysteresis, and the need to maintain the homogeneous and uniform magnetic field. The present invention recognizes that by providing a shielding layer of nonferromagnetic conducting material on the pole faces, eddy currents are transferred from the pole face to the nonferromagnetic layer, thus minimizing any induced hysteresis. A nonferromagnetic material, such as aluminum (Al) or copper (Cu) plates, is one such nonferromagnetic material which conducts electricity. The present invention further recognizes that hysteresis can be minimized by providing a pole face with a structure which substantially reduces the path of the eddy current. Unwanted eddy current effects can be minimized so that the time constant is shortened considerably, on the order of one millisecond or less. Moreover, the amplitude of the eddy current, voltage and current signature are reduced to a very small value, thus not introducing unwanted remnant gradients into the MRI system.

Accordingly, it is an object of the present invention to provide a method and apparatus for minimizing the hysteresis induced in the pole face of a permanent magnet-type MRI system. It is a further object of the present invention to provide a method and apparatus for achieving a highly uniform magnetic field suitable for use in MRI. It is yet another object of the present invention to provide a system and apparatus for minimizing hysteresis while maintaining uniformity in the magnetic field of the air gap of an MRI system. Still another object of the present invention is to provide a method and apparatus for minimizing hysteresis in the MRI system environment which is cost-effective and easily utilized and manufactured.

SUMMARY OF THE INVENTION

A preferred embodiment of the apparatus for minimizing hysteresis in a magnetic resonance imaging device of the type utilizing a pair of oppositely charged pole faces and a gradient coil spaced apart from and parallel to each pole face, comprises a layer of nonferromagnetic conducting material interposed between the pole face and gradient coil to carry eddy currents induced by time varying magnetic fields produced by the gradient coils. The layer has a thickness of at least one skin depth at the frequency associated with the time varying magnetic field. The layer is preferably contiguous with the pole face, and the nonferromagnetic conducting materials include copper or aluminum.

In another preferred embodiment of the present invention, each pole face has a plurality of slits therethrough radiating inwards from the circumference of each pole face to a point preferably within the smallest diameter of the associated gradient coil.

The novel features of this invention, as well as the invention itself, both as to its structure and its operation, will be best understood from the accompanying drawings, taken in conjunction with the accompanying description, in which similar reference characters refer to similar parts, and in which:

BRIEF DESCRIPTION OF THE DRAWINGS

FIG. 1 is a perspective view of an apparatus for minimizing hysteresis showing the present invention in its intended environment;

FIG. 2 is a side view of the apparatus in accordance with the present invention;

FIG. 3 is a top view of an alternative embodiment of the apparatus of the present invention; and FIG. 4 is a side view of the apparatus shown in FIG. 3.

DESCRIPTION OF THE PREFERRED EMBODIMENT

FIG. 1 shows an apparatus for minimizing hysteresis in its intended environment in accordance with the present invention, generally designated 10. In particular, there is shown a magnetic resonance imaging device 12 having a base 14 and a top 16. Top 16 is supported by four (4) generally cylindrical solid pillars 18. The base 14, top 16 and pillars 18 are made of ferrous material, such as iron (Fe) or iron alloys, which readily provide a path for magnetic flux generated by the device.

Base 14 and top 16 each support a ferromagnetic pole face 20 and 22, respectively. Pole faces 20 and 22 are oppositely charged and positioned parallel, being generally flat, and spaced apart to form a magnetic field in the gap 24 between the pole faces 20 and 22. In the MRI device, the object is to create a uniform magnetic field of flux of sufficient size to allow access by a human body within the air gap 24. The desired region of uniformity is characterized by a spherical volume 26 located within the gap 24 within which the magnetic flux is highly uniform.

It has been found through experimentation that permanent magnets may be used to magnetize pole faces 20, 22 with a pole face gap of approximately twenty-four (24) inches, and sufficiently strong permanent magnets to generate a field within the spherical volume of from six one hundredths (0.06) tesla to three tenths (0.3) tesla, with a desirable field uniformity of up to forty (40) parts per million over a spherical volume having a diameter of approximately thirty (30) centimeters.

In addition to the ferromagnetic pole faces 20 and 22, there is included in the MRI device gradient coils 30 and 32. Gradient coils 30 and 32 produce localized linear magnetic field gradients in the x, y and z direction as shown by arrows x, y, and z in FIG. 1. These localized gradients assist in achieving the uniformity desired in the region of volume 26. Gradient coils 30, 32 are parallel to and within a few centimeters of the ferromagnetic pole faces 20 and 22, respectively. Interposed between each pole face 20, 22 and each gradient coil 30, 32, respectively, is a layer 34, and a layer 36. Layers 34 and 36 are nonferromagnetic conducting materials, preferably aluminum or copper. The layers 34, 36 of nonferromagnetic conducting material are preferably contiguous with pole faces 20, 22, and spaced apart from gradient coils 30 and 32. This can be appreciated further with reference to FIG. 2.

In FIG. 2, there is shown bottom pole face 20 having layer 34 of nonferromagnetic conducting material positioned thereon, and gradient coil 30 superposed above pole face 20. The discussion respecting the bottom pole face 20 with reference to FIGS. 2 and 3 applies equally well to the top pole face 22.

As stated earlier, in operation of the MRI device, the gradient coils 30, 32 are pulsed to assist in producing localized linear gradients in the x, y and z direction for attaining the desired field uniformity within the spherical volume. Unfortunately, such pulses in the gradient coil create AC eddy current induced hysteresis. As earlier explained, eddy currents are induced in conducting specimens, such as the pole faces, and themselves create opposing field gradients which degrade the desired uniformity of the magnetic field. The eddy current induces hysteresis as a result of the rapidly changing opposing magnetic fields induced by the eddy current. The eddy current in the ferromagnetic pole face 20 is minimized, however, by the layer 34 of nonferromagnetic conducting material, since the eddy current, being generated by the gradient coil 30, is intercepted by the interposed layer 34. The eddy current instead flows in the nonferromagnetic layer 34, and not in ferromagnetic pole face 20. Since layer 34 is a nonferromagnetic material, the eddy currents induced in the conducting layer 34 thus minimize any induced hysteresis in pole face 20, and thus have little or no affect on the uniformity of the magnetic field and spherical volume 26.

It is desirable that the layer 34 be of a thickness which does not add appreciably to the cost of manufacture of the MRI device, nor interfere with its operation, yet be sufficient to have its intended effect in accordance with the present invention. It has been found that a sufficient thickness is that of approximately one or more skin depth thicknesses. The skin depth thickness is proportional to the inverse square root of the frequency associated with the time varying magnetic field of the gradient coils which is inducing the eddy currents in the layer 34. The skin depth, or depth of penetration, is also a characteristic of the material. A nonferromagnetic conducting material such as aluminum or copper should be utilized.

For copper material for example, at sixty (60) Hz, the skin depth is $8.5 \times 10^{-3}$ meters, at one (1) mHz, skin depth is $6.6 \times 10^{-5}$ meters, and at thirty (30) gHz, skin depth is $3.8 \times 10$ meters. The appropriate skin depth thickness of the layer 34 can thus be readily determined based on the material chosen and the frequencies associated with operation of the MRI device in order to realize the benefits of the present invention. It should be kept in mind that the gradient coils 30 are typically within a few centimeters of pole face 20, so that the thickness of layer 34 must be sufficiently thin to allow its placement therebetween.

There is shown in FIG. 3 an alternative preferred embodiment of the present invention where, in addition to, or instead of, a layer 34, there are a number of radial slits 38 in pole face 20. The plurality of radial slits 38 radiate inward from the circumference 40 of pole face 20 to an inner point 42. Inner point 42 is a point preferably located within the smallest diameter of the x, y or z gradient coils contained within gradient coil 30. The radial slits extend completely through the depth of pole face 20. In addition, to prevent degradation of the structural strength of pole face 20, slits 38 alternate with shorter slits 38', which end at alternating points 42' near the center of pole face 20. This provides short slits 38' alternating between slits 38. The slits may also be filled with electrical insulation material to further prevent any conducting of current between the various pole face portions 44. The effect of the slits is to minimize the eddy current from being induced throughout the plate as shown by arrow 46 of FIG. 1, and instead allow much smaller induced eddy currents as shown by arrow 48 in portions 44 which in effect minimize the eddy current effect. The plurality of slits in effect prevents a large AC induced eddy current from being set up, and therefore reduces the hysteresis effect to the point that there are insignificant affects on the uniformity of the magnetic field in the spherical volume 26.

In the embodiment shown in FIG. 3, the slits are preferably placed at an angle $\theta$, equidistant from one another. In the embodiment shown there are twenty-four (24) slits placed at fifteen degrees (15°) from one another In this alternative embodiment, layer 34 is not required, but layer 34 could be utilized if it was so desired. In this embodiment, the slits may be less than one-sixteenth (1/16) of an inch wide, as long as they are of sufficient width to prevent flow of current in its path around ferromagnetic pole face 20, as discussed above. Moreover, it will be appreciated by the skilled artisan that the positioning of the slits in the top pole face 22 should be symmetrical to those in the bottom pole face 20.

As further shown in FIG. 4, there may be an annular member 50 mounted to the outer perimeter of pole face 20. Annular member 50 is utilized to assist in achieving a uniform field as disclosed in applicant's co-pending U.S. Patent Application Serial No. 360,028, assigned to the same assignee as the present invention. A thin layer of insulation 52, such as nine thousandths (0.009) inch thick plastic, is placed between annular member 50 and pole face 20. This insulation 52 isolates annular member 50 from pole face 20, and prevents annular member 40 from providing an electrical connection between adjacent pole face portions 44 at the outer periphery of pole face 20 across slits 38, 38'. Furthermore, to further minimize any AC induced eddy current effect, and associated hysteresis, in the annular member 50, a series of slits 54 are also made in the annular member 50 itself. In the preferred embodiment shown, there are four (4) such slits spaced in equidistant positions, i.e. ninety degrees (90°) apart.

While the particular method and apparatus of reducing magnetic hysteresis as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as defined in the appended claims.

What is claimed is:

1. An apparatus for minimizing hysteresis in a magnetic resonance imaging device of the type utilizing a pair of oppositely charged, flat, parallel pole faces forming a magnetic field therebetween, and a gradient coil spaced apart from and parallel to each pole face for producing time varying magnetic fields at a frequency, comprising:
a layer of nonferromagnetic conducting material interposed between said pole face and said gradient coil to carry eddy currents induced by said time varying magnetic fields produced by said gradient coils.

2. An apparatus as recited in claim 1, wherein said layer has a thickness of at least one skin depth at the frequency associated with said time varying magnetic field.

3. An apparatus as recited in claim 2, wherein said layer is contiguous with said pole face.

4. An apparatus as recited in claim 3, wherein said layer is copper.

5. An apparatus as recited in claim 3, wherein said layer is aluminum.

6. An apparatus for minimizing hysteresis in a magnetic resonance imaging device of the type utilizing a pair of oppositely charged, flat, parallel pole faces forming a magnetic field therebetween, and a gradient coil spaced apart from and parallel to each pole face for producing time varying magnetic fields at a frequency, comprising:
each said pole face having a plurality of slits therethrough radiating inward from the circumference thereof to a point within the smallest diameter of said gradient coil.

7. An apparatus as recited in claim 6, wherein each said slit is filled with insulation material.

8. An apparatus as recited in claim 7, wherein said slits are positioned equidistant from one another.

9. An apparatus as recited in claim 8, wherein there are twenty-four (24) slits spaced apart at angles of fifteen degrees (15°).

10. An apparatus as recited in claim 9, wherein each said slit is approximately one-sixteenth (1/16) inch wide.

11. A method of minimizing hysteresis in a magnetic resonance imaging device of the type utilizing a pair of oppositely charged, flat, parallel pole faces forming a magnetic field therebetween, and a gradient coil spaced apart from and parallel to each pole face for producing time varying magnetic fields at a frequency, comprising the steps of:
providing a layer of nonferromagnetic conducting material having a thickness of at least one skin depth at the frequency associated with said time varying magnetic field; and
positioning said layer between said pole face and said gradient coil.

12. A method as recited in claim 11, wherein said positioning step includes placing said layer contiguous with said pole face.

13. A method of minimizing hysteresis in a magnetic resonance imaging device of the type utilizing a pair of oppositely charged, flat, parallel, generally circular pole faces forming a magnetic field therebetween, and a gradient coil spaced apart from and parallel to each pole face for producing time varying magnetic fields at a frequency, comprising the step of:
cutting a plurality of slits radially through each said pole face, said slits being located in one of said pole faces symmetrical to said slits in said opposite pole face.

14. A method as recited in claim 13, wherein said cutting step includes cutting said slits spaced apart equally from one another.

15. A method as recited in claim 14, wherein said cutting step includes cutting twenty-four (24) slits at angles of fifteen degrees (15°) from one another.

16. A method as recited in claim 15, wherein said slits alternate in length.

* * * * *